United States Patent
Kim

(10) Patent No.: US 6,372,571 B2
(45) Date of Patent: Apr. 16, 2002

(54) METHOD OF MANUFACTURING SEMICONDUCTOR DEVICE

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/747,555

(22) Filed: Dec. 22, 2000

(30) Foreign Application Priority Data

Dec. 23, 1999 (KR) ............................... 99-61042

(51) Int. Cl.[7] .......................................... H01L 21/8242
(52) U.S. Cl. ..................... 438/239; 438/253; 438/396
(58) Field of Search ............................... 438/239, 253, 438/254, 255, 256, 396, 397, 398, 399, 258

(56) References Cited

U.S. PATENT DOCUMENTS

| | | |
|---|---|---|
| 5,332,687 A | 7/1994 | Kuroda |
| 5,484,744 A | 1/1996 | Hong |
| 5,488,008 A | 1/1996 | Kawamura |
| 5,572,053 A | 11/1996 | Ema |
| 5,804,479 A * | 9/1998 | Aoki et al. .................. 438/253 |
| 5,926,710 A | 7/1999 | Tseng |
| 5,937,322 A * | 8/1999 | Matsuura .................... 438/622 |
| 6,037,216 A * | 3/2000 | Liu et al. .................... 438/253 |
| 6,083,788 A | 7/2000 | Lian et al. |
| 6,127,260 A * | 10/2000 | Huang ........................ 438/629 |

* cited by examiner

Primary Examiner—Tuan H. Nguyen
(74) Attorney, Agent, or Firm—Timothy J. Keefer; Wildman, Harrold, Allen & Dixon

(57) ABSTRACT

Provided is a method of manufacturing a semiconductor device having a stacked capacitor configured to reduce a step difference between a memory cell region and a logic circuit region adjacent thereto. In the method of manufacturing a semiconductor device, a sacrificial film removed after formation of the semiconductor device having a stacked capacitor, is preserved in the logic circuit region to be used as an interlayer insulating film. Thus, a step difference between a memory cell region having the capacitor and a logic circuit region, is removed, thereby facilitating formation of multi-layered interconnection wirings formed after forming the capacitor, and attaining fineness of the interconnection wirings.

15 Claims, 12 Drawing Sheets

METHOD OF MANUFACTURING SEMICONDUCTOR DEVICE

CROSS REFERENCE TO RELATED APPLICATION

This application claims the priority of Korean patent application Ser. No. 99-61042 filed on Dec. 23, 1999.

BACKGROUND OF THE INVENTION

1. Field of the Invention

The present invention relates to a method of manufacturing a semiconductor device, and more particularly, to a method of manufacturing a semiconductor device configured to reduce a step difference between a memory cell region and a logic circuit region adjacent thereto, thereby attaining fineness of interconnection wirings.

2. Description of the Related Art

Recently, in accordance with high integration and high performance of a semiconductor device, the cell size is gradually reduced. Accordingly, the height of a stacked capacitor provided in a semiconductor device becomes increased so as to cope with the reduced cell size and to attain a required secured capacitance.

In other words, in order to compensate for a reduction in the surface area of a dielectric corresponding to the reduced cell size, the height of a stacked capacitor is increased, resulting in a relatively large step difference between a memory cell region where the capacitor is formed, and a logic circuit region adjacent thereto.

A method of manufacturing a conventional semiconductor device will be described with reference to FIG. 1.

FIG. 1 is a cross-sectional view illustrating a method of manufacturing a conventional semiconductor device.

According to the method of manufacturing a conventional semiconductor device, as shown in FIG. 1, a predetermined logic circuit is formed on a logic circuit region A on a semiconductor substrate 10, and a first etching stopper film 11 is formed on a memory cell region B by depositing nitride on the entire surface where a plurality of transistors for driving a capacitor to be formed in a subsequent process, are formed.

Then, oxide is stacked on the first etching stopper film 11 and then planarized by a chemical mechanical polishing (CMP) process, thereby forming a first interlayer insulating film 21.

Here, reference numeral 1 denotes a well of first conductivity type (e.g., an n-type), 2 denotes a well of a second conductivity type (e.g., a p-type), 3 denotes an isolation insulating layer, 4 denotes an active region used as a source electrode 4a or a drain electrode 4b, 5 denotes a gate oxide layer, 6 denotes a gate electrode, and 7 denotes an intermediate insulating film.

Subsequently, a first contact hole (not shown) exposing the drain electrode 4b in the memory cell region B is formed by partially removing the first interlayer insulating film 21 of the memory cell region B and the first etching stopper film 11.

Next, the first contact hole is filled with a conductive material (e.g., polysilicon), and then the conductive material remaining on the first interlayer insulating film 21 is removed by an etch-back process, thereby forming a first contact plug 31.

Here, the first contact plug 31 formed in the drain electrode 4b of the memory cell region B is electrically connected to a charge preservation electrode in a subsequent process.

Also, when the drain electrode 4b in the memory cell region B is exposed, the source electrode 4a may also be exposed to form a contact plug, for forming a bit line contact in the contact plug during a subsequent process.

Subsequently, oxide is deposited on the entire surface of the structure having the first contact plug 31, thereby forming a second interlayer insulating film 22.

Next, the second interlayer insulating film 22, the first interlayer insulating film 21 and the first etching stopper film 11 are partially removed in sequence, thereby forming a second contact hole exposing the source electrode 4a in the memory cell region B to be connected with a bit line during a subsequent process, the active region 4 in the logic circuit region A to be connected with a first interconnection wiring, and the surface of the gate electrode 6.

Here, in the case where a contact plug is also formed in the source electrode 4a in the above-described process, the second contact hole for a bit line is formed on the contact plug.

Then, a conductive material is deposited over the second contact hole and on the second interlayer insulating film 22 to form a first conductive layer 41a and 41b, and then an insulating material is deposited on the entire surface of the first conductive layer 41a and 41b to form a second intermediate insulating film 25.

Here, the first conductive layer is patterned in a subsequent process, so that the first conductive layer 41a remaining in the logic circuit region A is used as an interconnection wiring and the first conductive layer 41b remaining in the memory cell region B is used as a bit line.

Thereafter, the second intermediate insulating film 25, the first conductive layer 41b and the second interlayer insulating film 22 disposed under the first conductive layer 41b, are patterned to form the interconnection wiring and the bit line.

Here, the second interlayer insulating film 22 is patterned to expose the surface of the first contact plug 31 or to allow the second interlayer insulating film 22 to be partially left over.

Next, nitride is deposited on the entire surface of the resultant structure to form a second etching stopper film 12, and an oxide film 24 is then deposited on the entire surface of the second etching stopper film 12 and planarized by a CMP process, thereby forming a third interlayer insulating film 23.

Subsequently, the second interlayer insulating film 22, the second etching stopper film 12 and the third interlayer insulating film 23 on the memory cell region B, are selectively removed to form a second contact plug 42 on the first contact plug 31.

Thereafter, a conductive material for a dielectric film and a conductive material for an upper electrode are sequentially deposited on the resultant structure, and then patterned to form a dielectric film 45 and an upper electrode 47.

Subsequently, an interlayer insulating film 49 is formed on the resultant structure, thereby completing a semiconductor device.

As described above, in the conventional semiconductor device manufacturing method, a step difference between the memory cell region B and the logic circuit region A adjacent thereto becomes severe.

Also, in the logic circuit region A formed in the vicinity of a capacitor, the line width of a wiring is reduced and the wiring space becomes narrower in accordance with high integration of a semiconductor device.

In order to increase the integration density, as the wiring is formed in multiple layers, the number of interconnection wirings for electrically connecting the multi-layered wiring increases.

While it is necessary to more accurately form patterns in the logic circuit region A for attaining high integration, the step difference caused by a capacitor becomes gradually severe. Thus, it is quite difficult to pattern layers formed after forming the capacitor, e.g., interconnection wirings.

In other words, according to the conventional method for forming a stacked capacitor, a large step difference between a memory cell region and a logic circuit region adjacent thereto makes it difficult to achieve fine interconnection wirings formed after forming the stacked capacitor. Also, the large step difference makes it difficult to form multi-layered interconnection wirings in the logic circuit region.

SUMMARY OF THE INVENTION

To solve the above problems, it is an object of the present invention to provide a method of manufacturing a semiconductor device, which can reduce a step difference between a memory cell region and a logic circuit region adjacent thereto.

It is another object of the present invention to provide a method of manufacturing a semiconductor device, which can attain fineness of interconnection wirings by simply forming multi-layered interconnection wirings. Accordingly, to achieve the first object, there is provided a method of manufacturing a semiconductor device having a logic circuit region, a transistor having a gate electrode, and source/drain electrodes, and a memory cell region having a stacked capacitor structure, the method including the steps of a first step of forming a first contact plug connected to the drain electrode, and forming a bit line connected to the source electrode and a first interconnection wiring connected to the respective electrodes in the logic circuit region, a second step of forming a second contact plug connected to the first contact plug, a third step of flatly forming an interlayer insulating film over the resultant structure having the second contact plug, a fourth step of forming a contact partially exposing an the upper portion of the first interconnection wiring by partially removing the interlayer insulating film, and forming a second interconnection wiring by filling up the contact with a conductive material, a fifth step of producing a space where a stacked capacitor is to be formed, by selectively removing a portion of the interlayer insulating film in the memory cell region, forming a charge preservation electrode on the side wall of the interlayer insulating film, and then removing the portion of the interlayer insulating film in the memory cell, a sixth step of forming a dielectric film and an upper electrode on the charge preservation electrode, and a seventh step of flatly forming an interlayer insulating film on the resultant structure.

To achieve the second object, there is provided a method of manufacturing a semiconductor device having a logic circuit region, a transistor having a gate electrode, and source/drain electrodes, and a memory cell region having a stacked capacitor structure, the method including the steps of a first step of forming a first contact plug connected to the drain electrode, and forming a bit line connected to the source electrode and a first interconnection wiring connected to the respective electrodes in the logic circuit region, a second step of forming a second contact plug connected to the first contact plug, a third step of flatly forming an interlayer insulating film over the resultant structure having the second contact plug, a fourth step of producing a space where a stacked capacitor is to be formed, by selectively removing a portion of the interlayer insulating film in the memory cell region, forming a charge preservation electrode on the side wall of the interlayer insulating film, and then removing the portion of the interlayer insulating film in the memory cell, a fifth step of forming a dielectric film and an upper electrode on the charge preservation electrode, and a sixth step of flatly forming an interlayer insulating film on the resultant structure.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Preferred embodiments of the present invention will now be described in detail with reference to the accompanying drawings.

FIGS. 2 through 10 are cross-sectional views illustrating processing steps of a method of manufacturing a semiconductor device according to an embodiment of the present invention.

Figure 1:
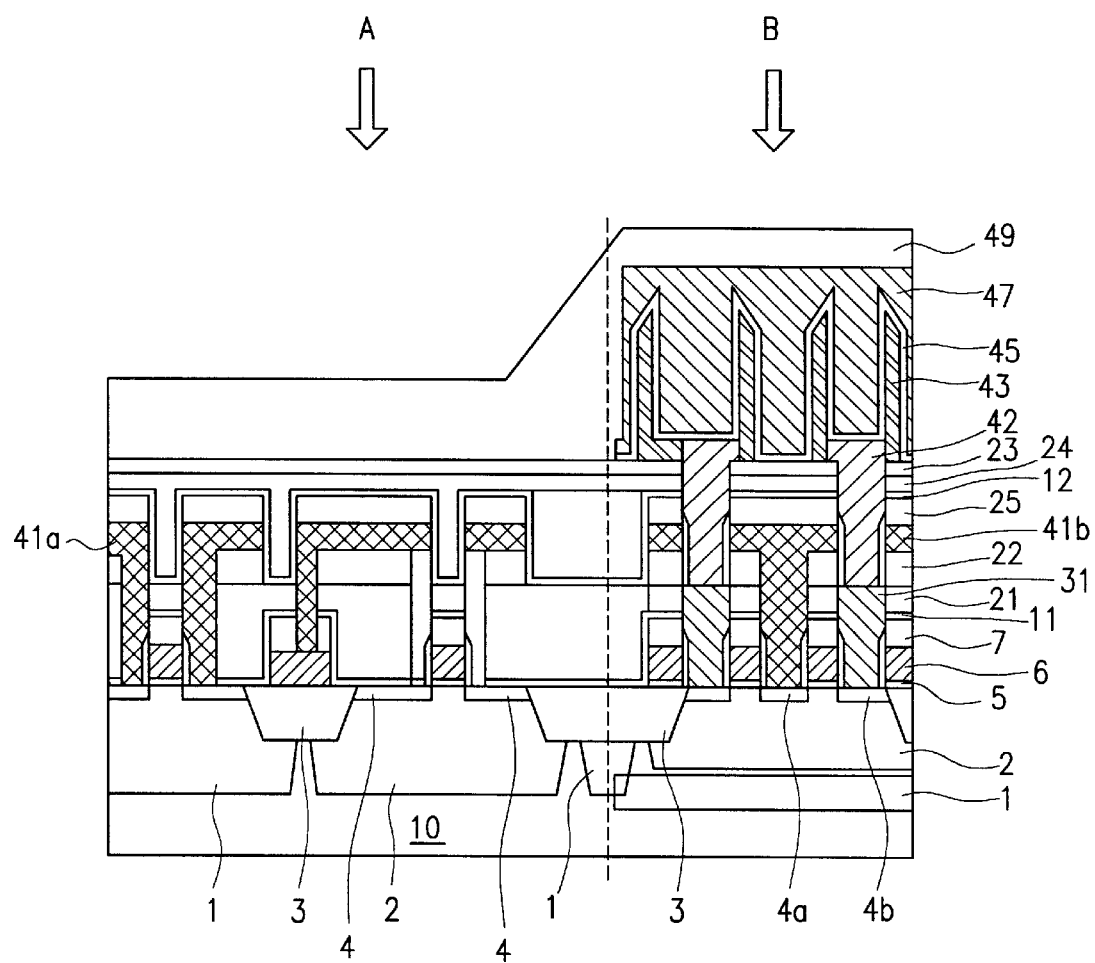
FIG. 1 is a cross-sectional view illustrating a conventional method of a semiconductor device.
Figure 2:
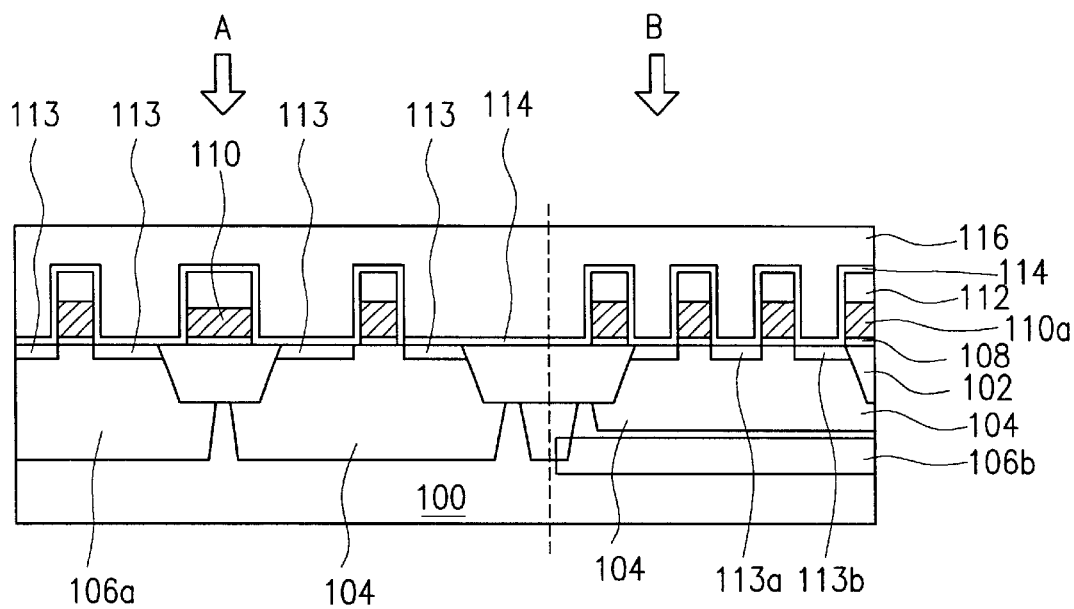
FIGS. 2 through 10 are cross-sectional views illustrating processing steps of a method of manufacturing a semiconductor device according to an embodiment of the present invention.

In method of manufacturing a semiconductor device according to an embodiment of the present invention, as shown in FIG. 2, logic circuits are formed in a logic circuit region A of a semiconductor substrate 100 in subsequent processing steps, and a transistor and a stacked capacitor are formed in a memory cell region B, respectively.

In other words, logic circuit elements and transistors having an isolation insulating film 102, p- and n-type wells 104, 106a and 106b, a gate insulating film 108, gate electrodes 110a and 110, source electrodes 113a and 113 and drain electrodes 113b and 113, are formed in the logic circuit region A and the memory cell region B.

Next, a first intermediate insulating film 112 is formed on the gate electrodes 110a and 110. A first etching stopper film 114 having a predetermined thickness according to a step difference, is formed on the isolation insulating film 102, the source and drain electrodes 113, 113a and 113b and the first intermediate insulating film 112. A first interlayer insulating film 116 is flatly formed on the first etching stopper film 114. Here, a bit line to be formed in a subsequent process is connected to the source electrode 113a of the memory cell region B, and a capacitor is connected to the drain electrode 113b.

An oxide or nitride film may be used as the first intermediate insulating film 112. Also, a nitride layer and an oxide layer may be used as the first etching stopper film 114 and the first interlayer insulating film 116, respectively.

Here, after thickly forming an insulating film (oxide film), the first interlayer insulating film 116 can be planarized by uniformly removing some of the insulating film by a CMP process.

Formation of the cross-sectional structure of a semiconductor device shown in FIG. 2 can be achieved by known methods in the art, and can easily realized by conventional techniques. Thus, a detailed explanation of specific processes for forming multiple layers (or films) will not be given in this embodiment.

Figure 3:
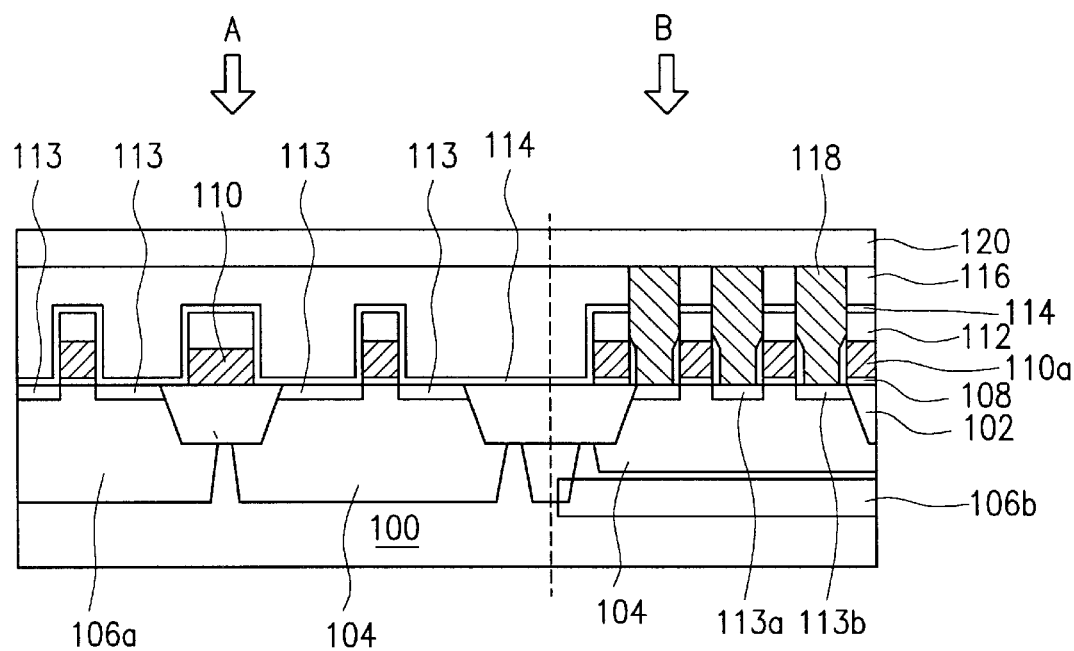

Next, as shown in FIG. 3, in the memory cell region B, contacts are formed on the source electrode 113a to be connected with a bit line and on the drain electrode 113b to be connected with a capacitor. That is, the first interlayer insulating film 116 is etched by an etching process in which a contact mask (not shown) and the first etching stopper film 114 are used as etching barriers, and the first etching stopper film 114 is partially removed, thereby forming contacts (not shown) exposing the upper portions of the source and drain electrodes 113a and 113b.

Thereafter, the thus-formed contacts are filled by deposit a conductive material, e.g., silicon, thereon, and the conductive material formed on the first interlayer insulating film 116 is removed by an etch-back process using an etching gas or by a CMP process, thereby forming a first contact plug 118 on the source and drain electrodes 113a and 113b of the memory cell region B.

Subsequently, oxide is deposited over the entire surface of the resultant structure having the first interlayer insulating film 116 and the first contact plug 118, thereby flatly forming a second interlayer insulating film 120.

Although it has been described in this embodiment that contacts and a contact plug are simultaneously formed on the source electrode 113a to be connected with a bit line and on the drain electrode 113b to be connected with a capacitor, the present invention is not limited thereto. Alternatively, a contact and a contact plug may be first formed only on the drain electrode 113b and then a contact may be formed on the source electrode 113a when a bit line contact is formed.

Thereafter, a contact is formed in the first contact plug 118 on the source electrode 113a to be connected with the bit line, and contacts are formed on source and drain electrodes 113 and the gate electrode 110 of the logic circuit region A to be connected with the first interconnection wiring.

Figure 4:
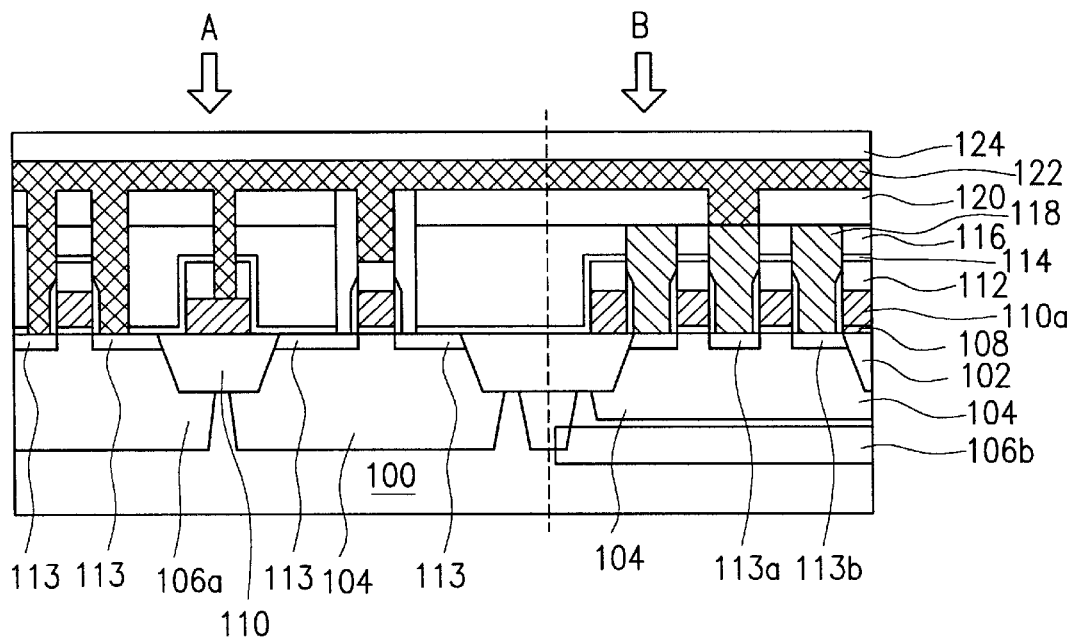

Subsequently, as shown in FIG. 4, a conductive material 122 and a second intermediate insulating film 124 are sequentially formed on the second interlayer insulating film 120 having the contact.

Here, the contacts formed in the source and drain electrodes 113 of the logic circuit region A may be self-aligned such that the second interlayer insulating film 120 and the first interlayer insulating film 118 are etched using a contact mask (not shown) and the first etching stopper film 114 as etching barriers and the first etching stopper film 114 is then etched.

Also, the conductive material 122 is used as a bit line in the memory cell region B and is used as a first interconnection wiring in the logic circuit region A. A stacked structure of titanium/titanium nitride/tungsten (Ti/TiN/W) is preferably used as the conductive material 122.

Otherwise, in the case where contacts and the first contact plug are not formed on the source electrode 113a to be connected with a bit line, the contacts may be simultaneously formed on the source electrode 113a to be connected with a bit line when the contacts are formed on the source and drain electrodes 113 of the logic circuit region A in a self-aligned manner.

Figure 5:
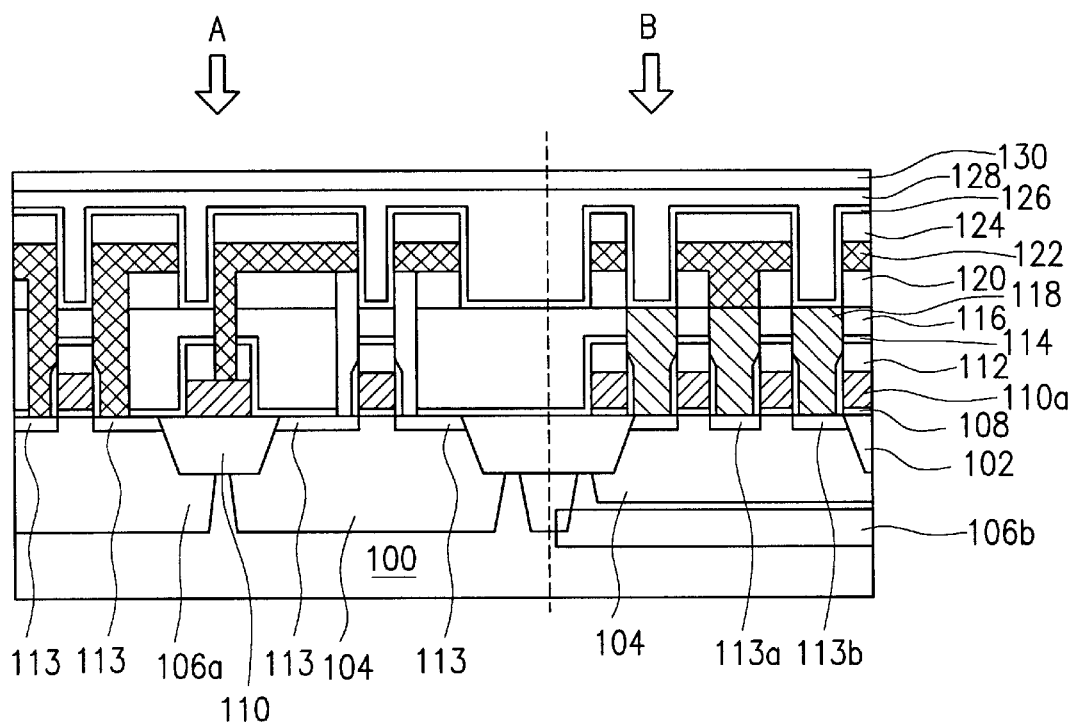

Next, as shown in FIG. 5, the second intermediate insulating film 124 and the conductive material 122 are etched by performing a photolithography process.

Subsequently, the second interlayer insulating film 120 is partially etched to expose the upper portion of the first contact plug 118 formed in the drain electrode 113b of the memory cell region B, thereby forming a bit line connected to the source electrode 113a of the memory cell region B and a first interconnection wiring connected to the source and drain electrodes 113 and the gate electrode 110b of the logic circuit region A. Here, the second interlayer insulating film 120 may be etched to be left thinly without exposing the upper portion of the first contact plug 118.

Subsequently, a second etching stopper film 126 having a predetermined thickness is formed on the resultant structure having the upper portion of the first contact plug 118 formed on the drain electrode 113b exposed, in accordance with the step difference. A third interlayer insulating film 128 is flatly formed on the second etching stopper film 126, and then a third etching stopper film 130 is formed on the third interlayer insulating film 128.

Here, a nitride film is preferably used as the second and third etching stopper films 126 and 130, and an oxide film is preferably used as the third interlayer insulating film 128. The third interlayer insulating film 128 can be flatly formed such that an insulating film is thickly formed and then some of the upper portion of the insulating film is uniformly removed by a CMP process.

Unlike the above, in this embodiment, an oxide film having a predetermined thickness may be formed on the third etching stopper film 130. This is for preventing the third etching stopper film 130 from being damaged when a second contact plug is formed on the first contact plug connected to the drain electrode 113b of the memory cell region B during a subsequent process.

Figure 6:
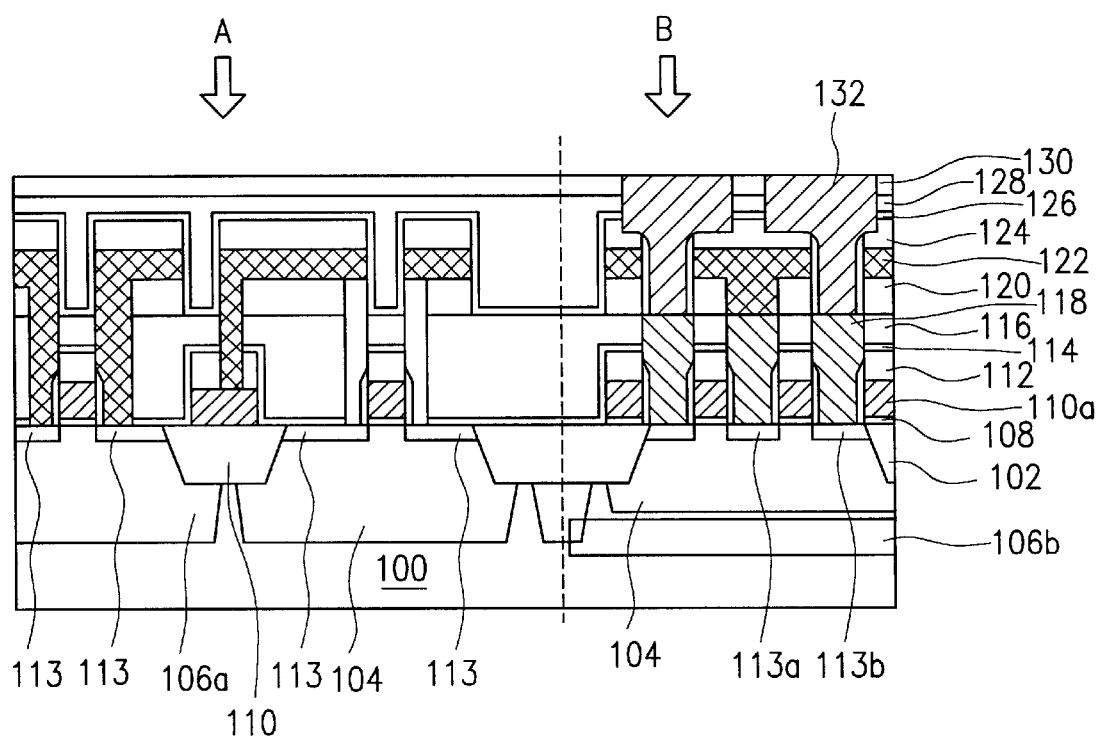

Next, as shown in FIG. 6, the third etching stopper film 130 over the drain electrode 113b is etched by an etching process using a contact mask (not shown), the third interlayer insulating film 128 is etched by an etching process using the second etching stopper film 126 as an etching barrier, and the second etching stopper film 126 is etched to form a contact (not shown) exposing the upper surface of the first contact plug 118 formed on the drain electrode 113b.

Subsequently, a conductive material filling up the contact is deposited on the entire surface of the resultant structure, and then the conductive material formed on the third etching stopper film 130 is removed by an etch-back process, e.g., using an etching gas or by a CMP process, thereby forming a second contact plug 132 connected to the first contact plug 118.

Figure 7:
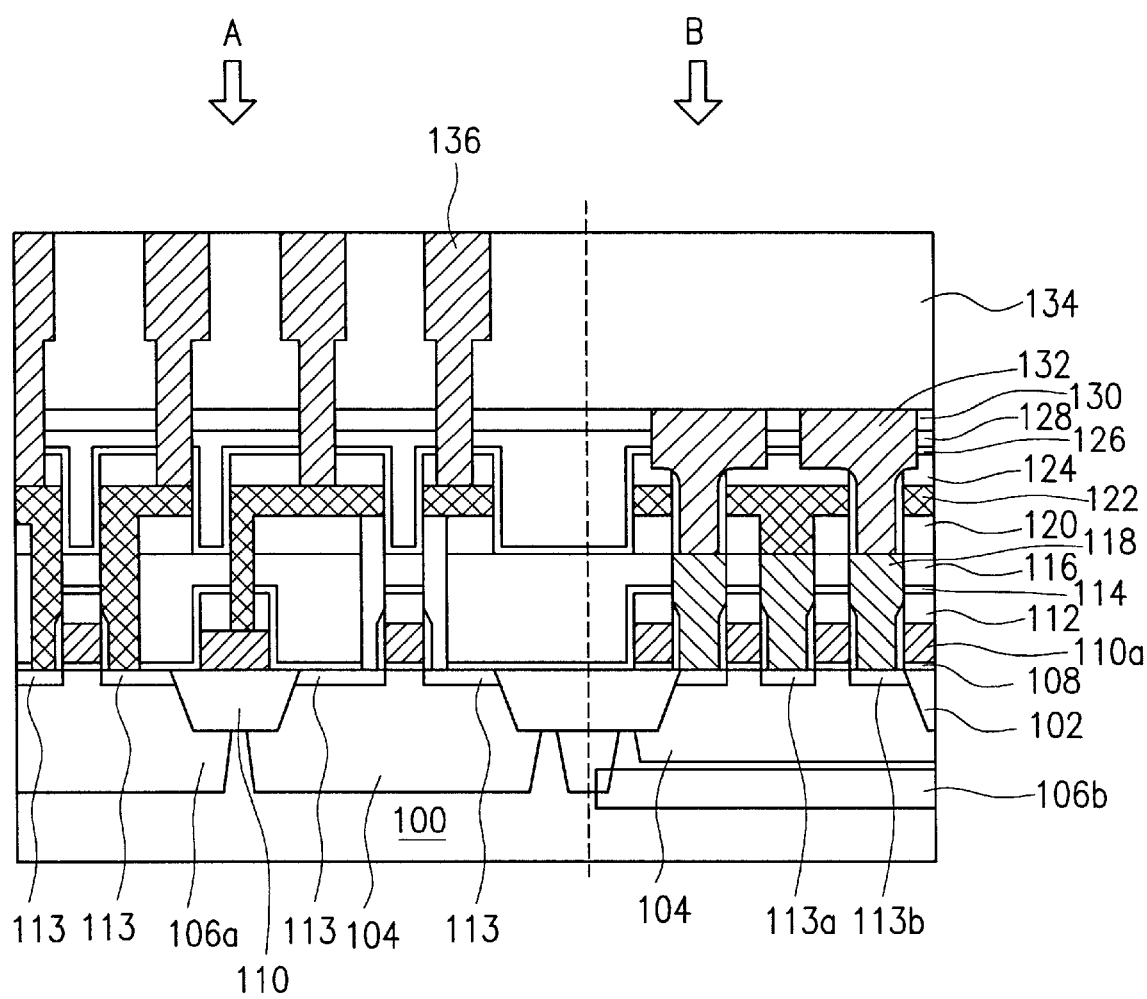

Next, as shown in FIG. 7, a fourth interlayer insulating film 134 is formed over the entire surface of the resultant structure having the second contact plug 132 and the fourth interlayer insulating film 134, the third etching stopper film 130, the third interlayer insulating film 128, the second etching stopper film 126 and parts of the second intermediate insulating film 124 are sequentially removed using a photolithography process, thereby forming a contact (not shown) exposing the upper surface of the first interconnection wiring 122b.

Here, whereas the fourth interlayer insulating film 134 formed of an oxide film, is used as an interlayer insulating film in the logic circuit region A, it is used as a sacrificial film during formation of a capacitor in the memory cell region B.

Subsequently, a conductive material for a second interconnection wiring is formed over the entire surface of the resultant structure having the contact to a predetermined thickness, to fill up the contact, and the residual upper portion of the fourth interlayer insulating film 134 is exposed by a CMP process or an etch-back process using etching gas, thereby forming a second interconnection wiring 136 connected to the first interconnection wiring 122b.

In this embodiment, the contact exposing parts of the upper portion of the first interconnection wiring 122b, is first formed, and a concavity in which the second interconnection wiring 136 is to be formed, is then formed. However, even though the formation sequence is reversed, the same result can be obtained. Unlike the above, in this embodiment, after a capacitor may be formed in the memory cell region B without formation of the second interconnection wiring 136, the second interconnection wiring 136 may be formed in the logic circuit region A. This is particularly advantageously used in the case where a capacitor is not relatively high.

Figure 8:
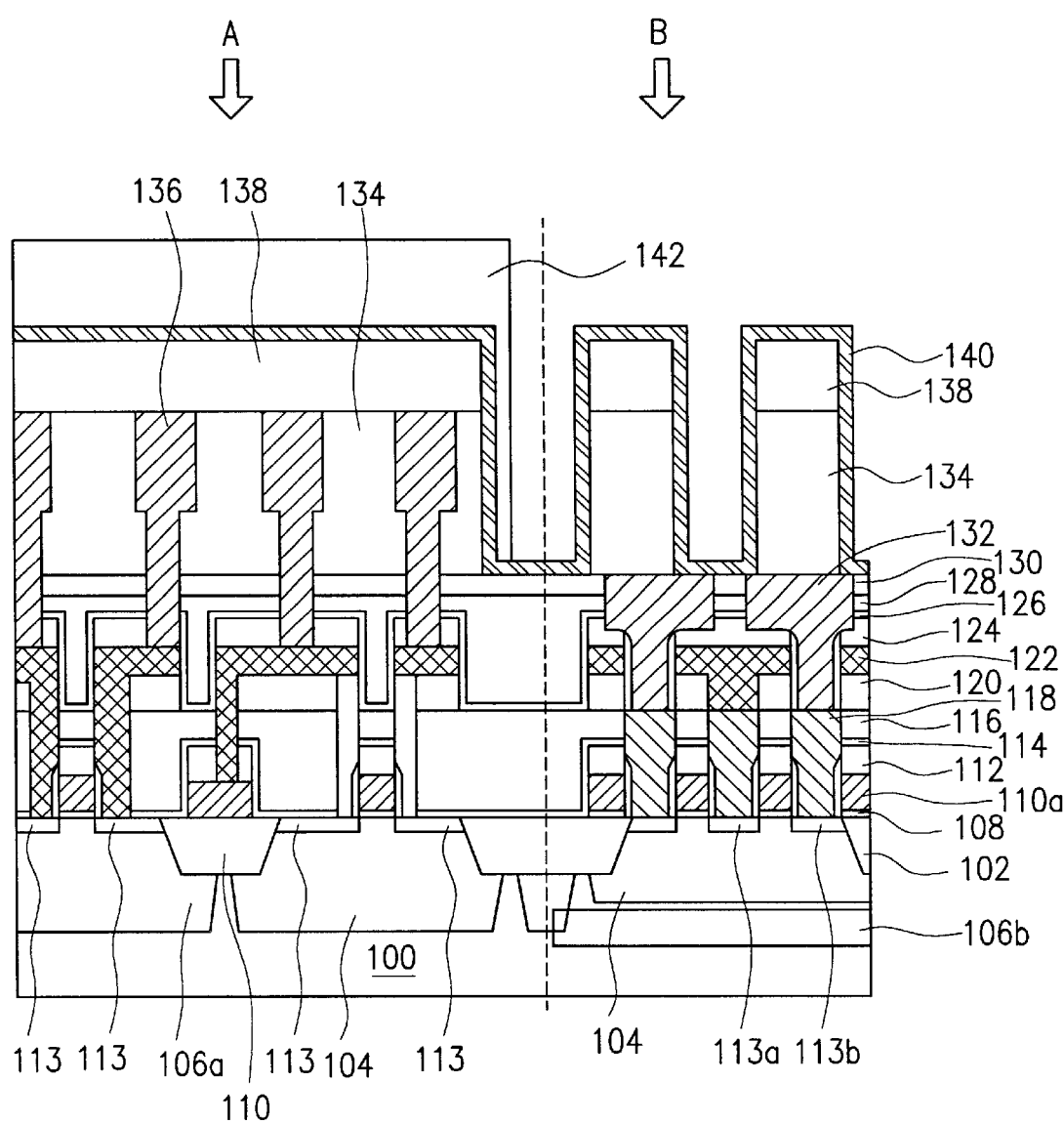

As shown in FIG. 8, a fifth interlayer insulating film 138 is formed over the entire surface of the resultant structure having the second interconnection wiring 136. The fifth and fourth interlayer insulating films 138 and 134 are partially removed in sequence by an etching process using a mask (not shown) for a charge preservation electrode to be patterned. Here, each one pattern corresponding to a unit cell is formed in the memory cell region B. The fifth and fourth interlayer insulating films 138 and 134 are preserved as they are in the logic circuit region A having the second interconnection wiring 136, while the fifth and fourth interlayer insulating films 138 and 134 existing on the interface between the memory cell region B and the logic circuit region A, are removed.

Subsequently, a conductive material 140 for a charge preservation electrode having a predetermined thickness is formed over the entire surface of the resultant structure having the patterned fifth interlayer insulating film 138, along the step difference, and then a photosensitive film 142 is coated over the conductive material 140 for a charge preservation electrode in the logic circuit region A.

Thereafter, the conductive material 140 for a charge preservation electrode is anisotrophically etched using the photosensitive film 142 as a mask so as to be left on the fifth interlayer insulating film 138 and on the side walls of the fourth interlayer insulating film 134.

Then, the photosensitive film 142 is removed, and the fifth and fourth interlayer insulating films 138 and 134 remaining on the memory cell region B are removed using the third etching stopper film 130 and the conductive material 140 for a charge preservation electrode in the logic circuit region A as etching barriers, thereby forming a cylindrical charge preservation electrode 140a connected to the second contact plug 132.

Figure 9:
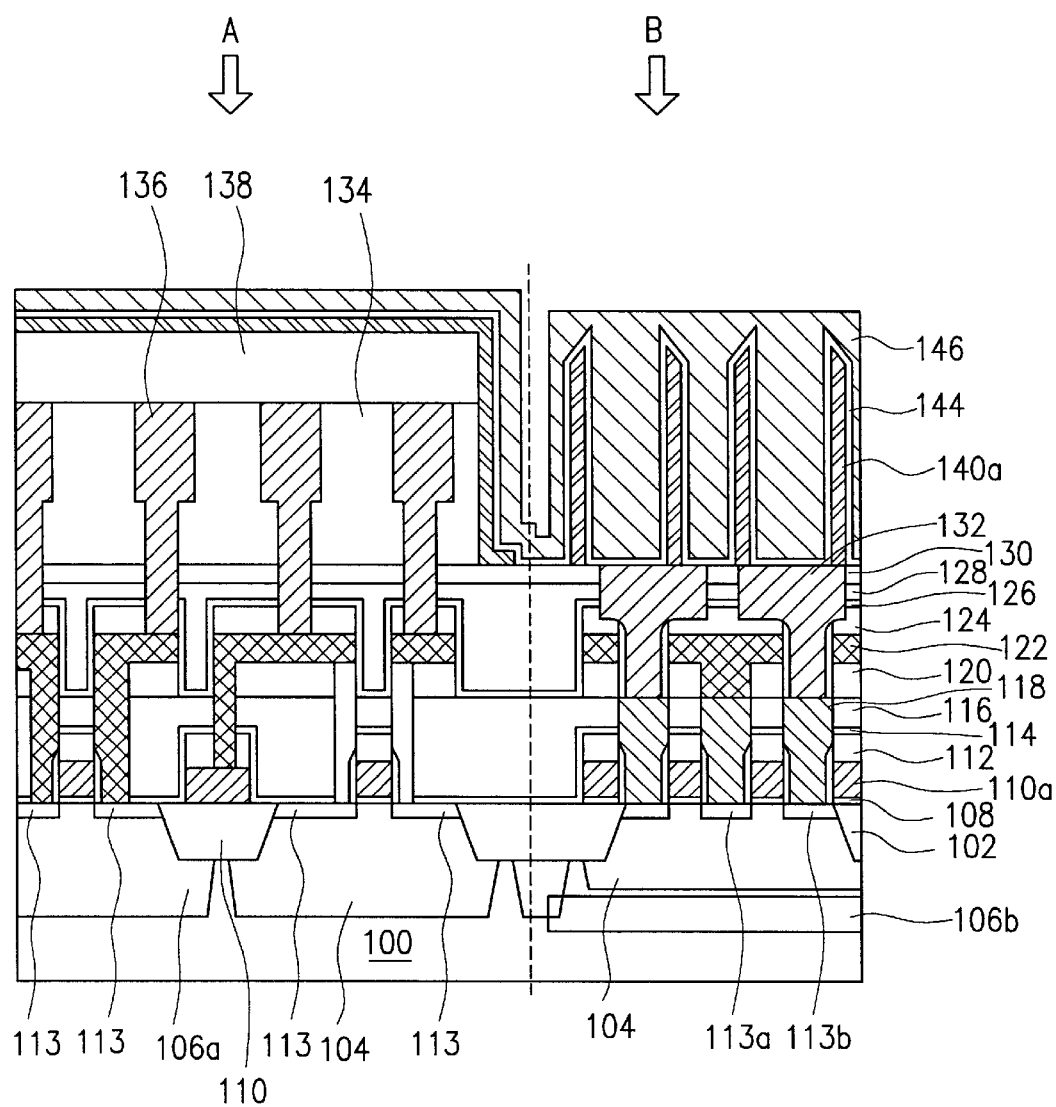

Next, as shown in FIG. 9, a capacitor dielectric film 144 having a predetermined thickness is formed over the entire surface of the resultant structure having the charge preservation electrode 140a, and a conductive material 146 for a plate electrode is formed over the entire surface of the capacitor dielectric film 144.

Figure 10:
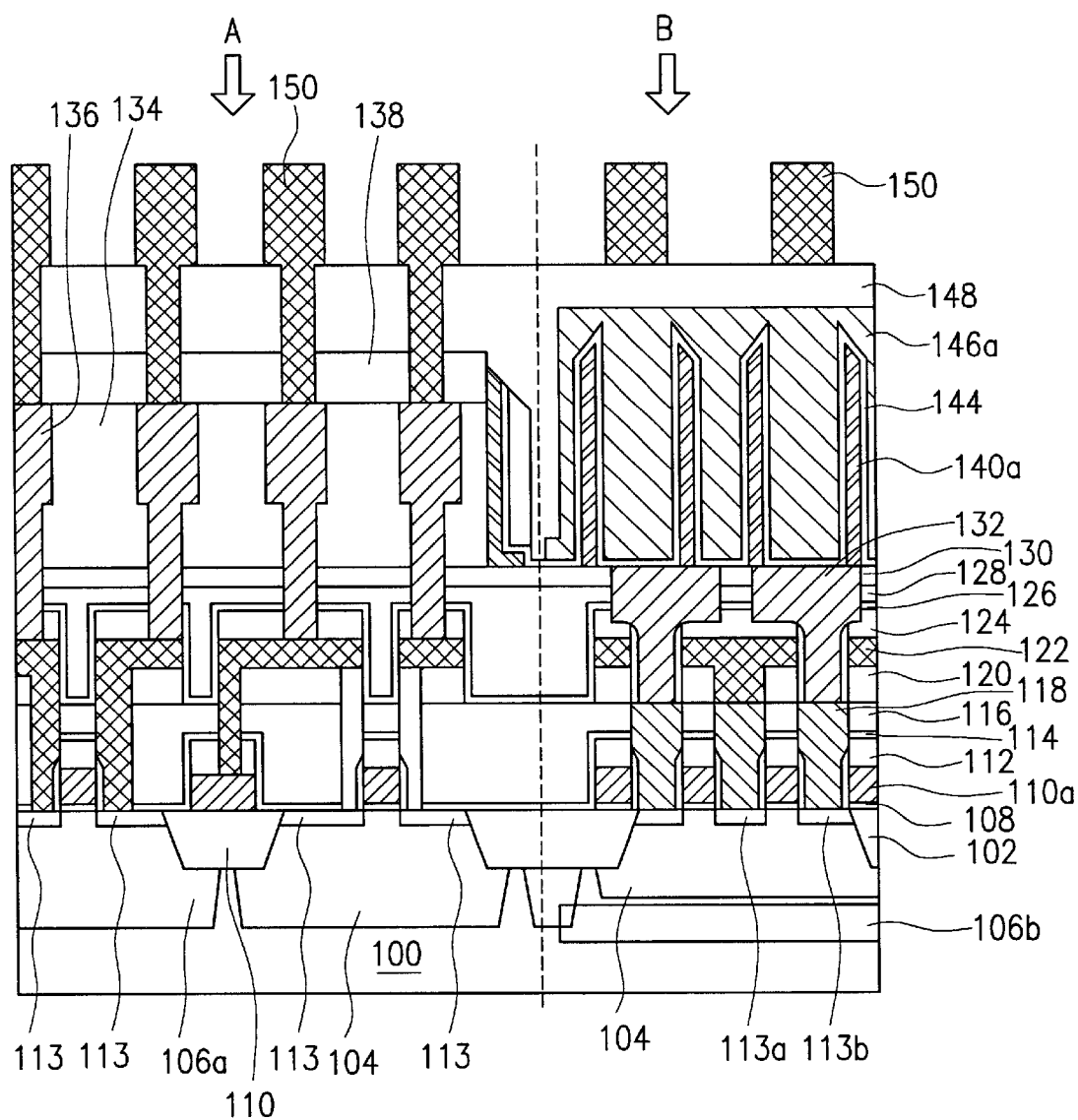

Subsequently, as shown in FIG. 10, the conductive material 156 for a plate electrode formed in the logic circuit region A, the capacitor dielectric film 144 and the conductive material 140 for a charge preservation electrode are sequentially etched by an etching process using a plate electrode mask (not shown), thereby forming a plate electrode 146a in the memory cell region B.

Thereafter, a sixth interlayer insulating film 148 is formed flatly on the resultant structure having the plate electrode 146a and then a third interconnection wiring 150 connected to the second interconnection wiring 136, thereby completing a semiconductor device having a stacked capacitor.

According to the above-described embodiment of the present invention, unlike the conventional semiconductor device having a large step difference between a memory cell region B and a logic circuit region A adjacent thereto, a sacrificial film removed in the course of forming a capacitor is preserved in a logic circuit region to be used as an interlayer insulating film, thereby completely removing a step difference between a memory cell region and the logic circuit region. Therefore, fineness of interconnection wirings formed over the capacitor can be effectively realized, and formation of multi-layered interconnections can be easily realized.

A method of manufacturing a semiconductor device according to another embodiment of the present invention will now be described in detail.

Figure 11:
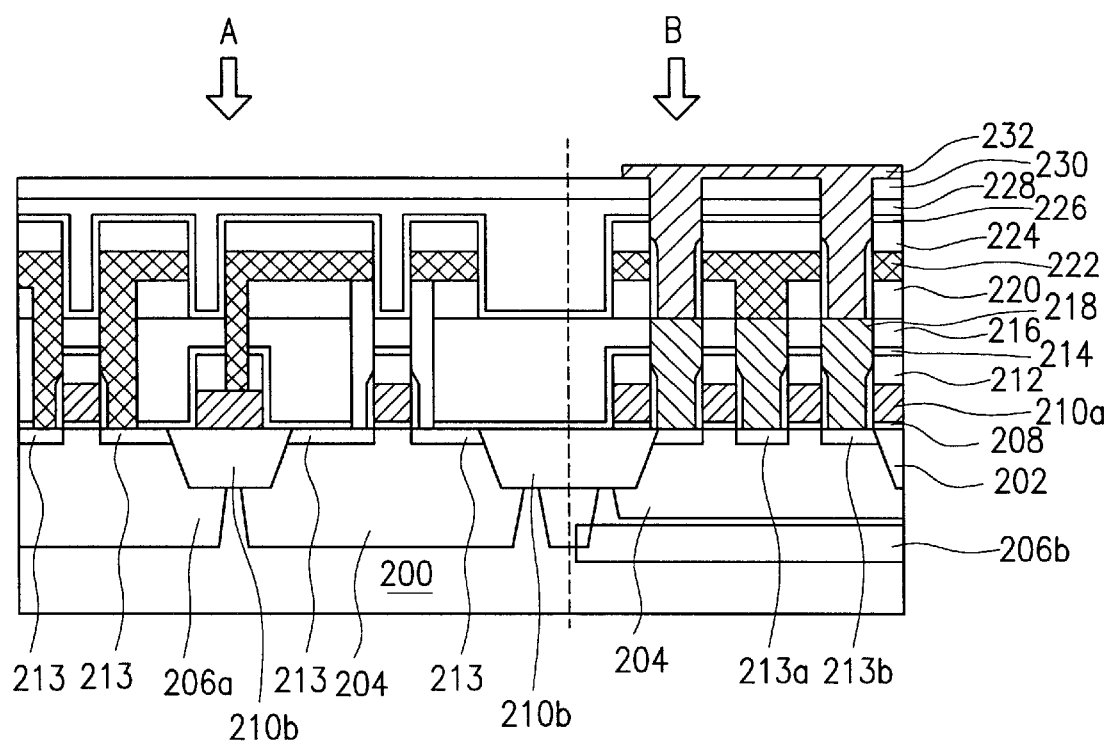
FIGS. 11 through 13 are cross-sectional views illustrating processing steps of a method of manufacturing a semiconductor device according to another embodiment of the present invention.
Figure 12:
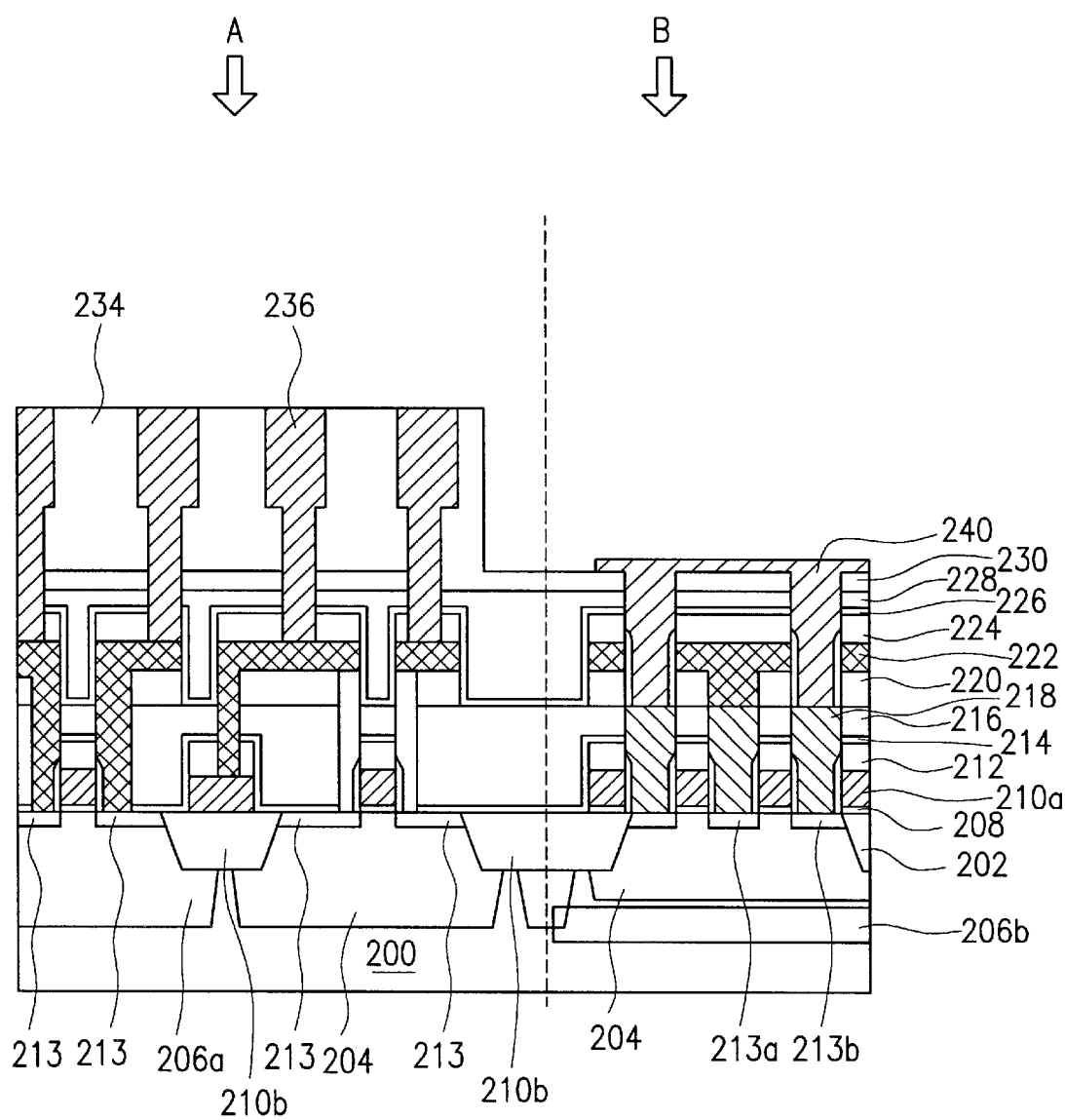
Figure 13:
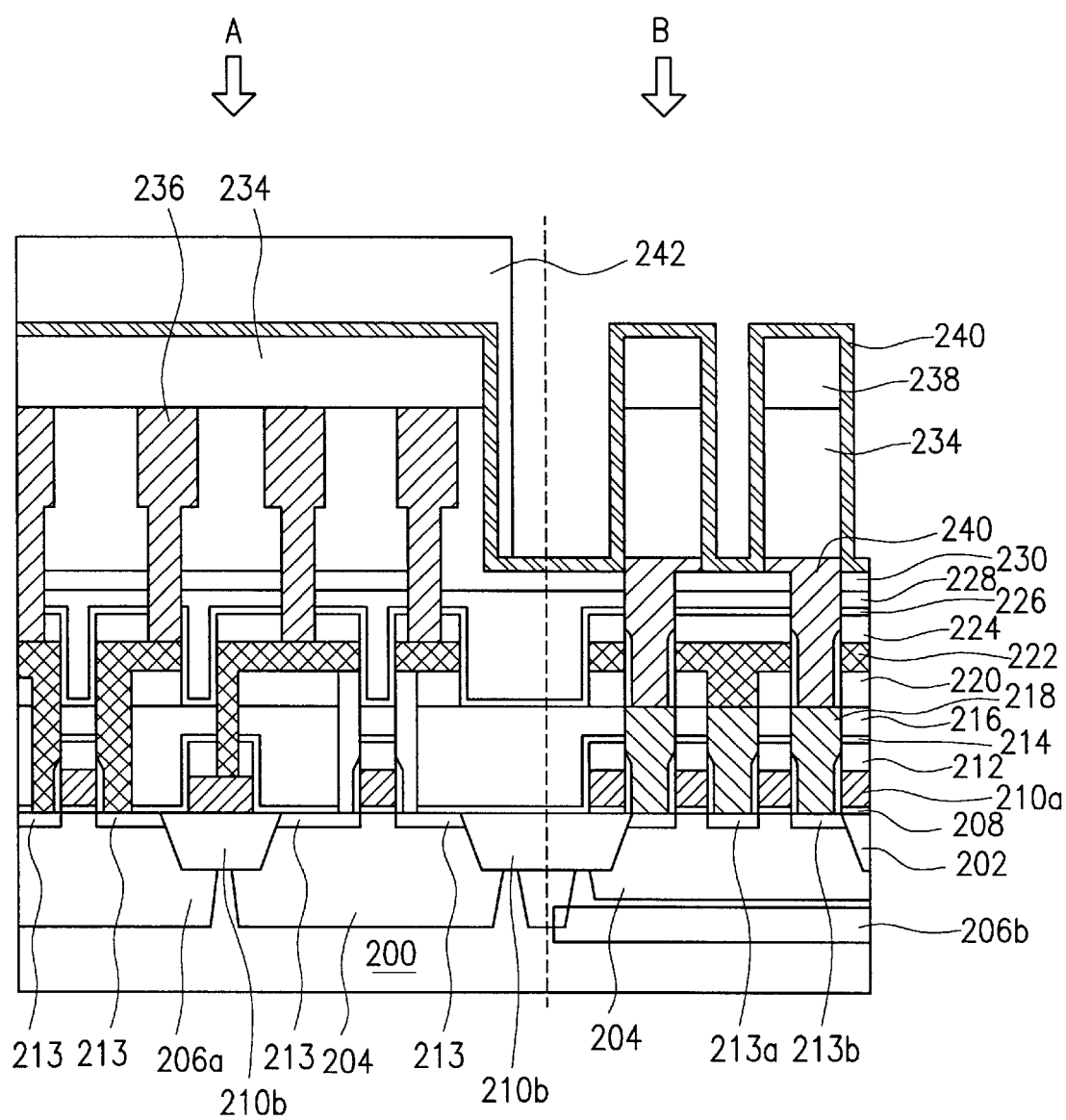

FIGS. 11 through 13 are cross-sectional views illustrating processing steps of a method of manufacturing a semiconductor device according to another embodiment of the present invention.

In the method of manufacturing a semiconductor device according to another embodiment of the present invention, as shown in FIG. 11, a transistor having a gate electrode 210a and source/drain electrodes 213a and 213b is formed, and a bit is then formed to expose the upper surface of a first contact plug 218.

Then, a second etching stopper film 226 and a third interlayer insulating film 228 are flatly formed over the entire surface of the resultant structure, and a third etching stopper film 230 is formed on the third interlayer insulating film 228, which is the substantially same as in the first embodiment of the present invention.

Subsequently, as shown in FIG. 11, in a state in which the third etching stopper film 230 is formed on the third interlayer insulating film 228, the third etching stopper film 230 over the drain electrode 213b is etched by an etching process using a contact mask (not shown) and the third interlayer insulating film 228 is etched by an etching process using the contact mask and the second etching stopper film 226 as etching barriers.

Thereafter, the second etching stopper film 226 is etched using a mask (not shown) for etching an etching stopper film to form a contact (not shown) exposing the upper surface of the first contact plug 218.

Subsequently, a conductive material is deposited to fill up the thus-formed contact and then patterned to allow the conductive material formed in the memory cell region B to be left over and to remove the conductive material formed in the logic circuit region A, thereby forming a second contact plug 232 connected to the first contact plug 218.

Here, unlike the first embodiment, two neighboring second contact plugs 232 each connected to the first contact plug 218 on the drain electrode 213b are connected to each other.

Next, as shown in FIG. 12, a fourth interlayer insulating film 234 is formed on the resultant structure having the second contact plug 232. The fourth interlayer insulating film 234, the third etching stopper film 230, the third interlayer insulating film 228, the second etching stopper film 226 and parts of the second intermediate insulating film 224 are sequentially removed by a photolithography process, thereby forming a contact (not shown) exposing the upper portion of the first interconnection wiring 222b in the logic circuit region A.

Subsequently, the fourth interlayer insulating film 234 is etched to a predetermined thickness by a photolithography process, thereby forming a concavity to be used as a second interconnection wiring by a subsequent process.

Here, whereas the fourth interlayer insulating film 234 formed of oxide is used as an interlayer insulating film in the logic circuit region A, it is used as a sacrificial film during formation of a capacitor, in the memory cell region B.

Next, a conductive material for a second interconnection wiring is formed on the resultant structure having the contact (not shown) and the concavity (not shown) to a predetermined thickness to fill up the contact and concavity, and then the remaining upper portion of the fourth interlayer insulating film 234 is exposed by a CMP process or an etch-back process using an etching gas, thereby forming a second interconnection wiring 236.

In this embodiment, it has been described that the contact (not shown) partially exposing the upper portion of the first interconnection wiring 222b is first formed and the concavity (not shown) where the second interconnection wiring 236 is to be formed, is then formed. However, even if the formation sequence is reversed, the same result can be obtained. Unlike the above, in this embodiment, after a capacitor may be first formed in the memory cell region B without formation of the second interconnection wiring 236, the second interconnection wiring 236 may be formed in the logic circuit region A. This is particularly advantageously used in the case where a capacitor is not relatively high.

As shown in FIG. 13, a fifth interlayer insulating film 238 is formed over the entire surface of the resultant structure having the second interconnection wiring 236. The fifth and fourth interlayer insulating films 238 and 234 are partially removed in sequence by an etching process using a mask (not shown) for a charge preservation electrode to be patterned.

Here, the two neighboring second contact plugs 232 connected to each other are partially removed to be isolated from each other.

Also, each one pattern corresponding to a unit cell is formed in the memory cell region B. The fifth and fourth interlayer insulating films 238 and 234 are preserved as they are in the logic circuit region A having the second interconnection wiring 236, while the fifth and fourth interlayer insulating films 238 and 234 existing on the interface between the memory cell region B and the logic circuit region A, are removed.

Subsequently, a conductive material 240 for a charge preservation electrode having a predetermined thickness is formed over the entire surface of the resultant structure having the patterned fifth interlayer insulating film 238, along the step difference, and then a photosensitive film 242 is coated over the conductive material 240 for a charge preservation electrode in the logic circuit region A.

Then, the processes for forming a charge preservation electrode (not shown), a capacitor dielectric film (not shown) and a plate electrode (not shown) are the substantially same as those in the first embodiment, and an explanation thereof will be omitted herein.

As described above, in the manufacturing method according to another embodiment of the present invention, like in the first embodiment, a sacrificial film removed in the course of forming a capacitor is preserved in a logic circuit region to be used as an interlayer insulating film, thereby completely removing a step difference between a memory cell region and the logic circuit region. Therefore, the substantially same effects as those in the first embodiment can be obtained.

A method of manufacturing a semiconductor device according to still another embodiment of the present invention will now be described in detail with reference to the accompanying drawing.

Figure 14:
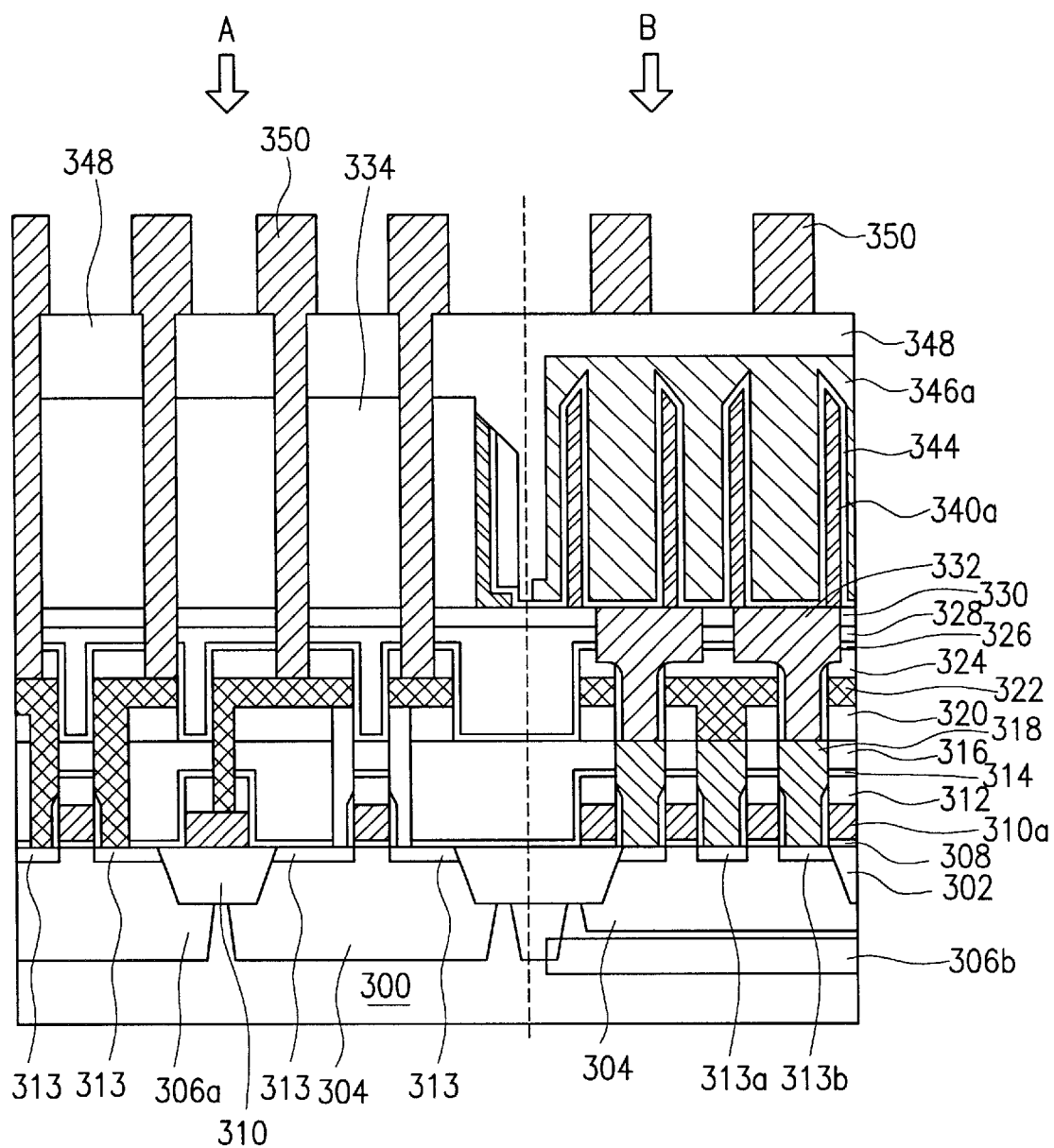
FIG. 14 is a cross-sectional view illustrating a method of manufacturing a semiconductor device according to a still another embodiment of the present invention.

FIG. 14 is a cross-sectional view illustrating a method of manufacturing a semiconductor device according to a still another embodiment of the present invention.

The method of manufacturing a semiconductor device according to a still another embodiment of the present invention has the same processing steps as those in the first embodiment, unlike in FIG. 7 illustrating the first embodiment, the second interconnection wiring 135 is not formed in the logic circuit region A, and the processing steps are the substantially same as those in the first embodiment, except that after a capacitor is first formed in the memory cell region B and a sixth interlayer insulating film 348 is formed on the capacitor, the sixth interlayer insulating film 348, the fourth interlayer insulating film 334, the third etching stopper film 330, the third interlayer insulating film 328, the second etching stopper film 326 and the second intermediate insulating film 324 are sequentially removed by an etching process, thereby forming a contact (not shown) in a first interconnection wiring, and then forming a second interconnection wiring 350 through the contact. Thus, an explanation of the processing steps other than the step of forming the second interconnection wiring 350 will not be given herein.

The above-described method of manufacturing a semiconductor device according to still another embodiment of the present invention is particularly preferred in the case where the capacitor is not relatively high, and the same result as that in the first or second embodiment can be obtained.

As described above, in the method of manufacturing a semiconductor device according to the present invention, a sacrificial film removed after formation of the semiconductor device having a stacked capacitor, is preserved in the logic circuit region to be used as an interlayer insulating film, unlike in the conventional method in which a step difference between a memory cell region and a logic circuit region adjacent thereto is large. Thus, a step difference between a memory cell region having the capacitor and a logic circuit region, is removed, thereby facilitating formation of multi-layered interconnection wirings formed after forming the capacitor, and attaining fineness of the interconnection wirings.

What is claimed is:

1. A method of manufacturing a semiconductor device having a logic circuit region, a transistor having a gate electrode, and source/drain electrodes, and a memory cell region having a stacked capacitor structure, the method comprising the steps of:

a first step of forming a first contact plug connected to the drain electrode, and forming a bit line connected to the source electrode and a first interconnection wiring connected to the respective electrodes in the logic circuit region;

a second step of forming a second contact plug connected to the first contact plug;

a third step of flatly forming an interlayer insulating film over the resultant structure having the second contact plug;

a fourth step of forming a contact partially exposing an the upper portion of the first interconnection wiring by partially removing the interlayer insulating film, and forming a second interconnection wiring by filling up the contact with a conductive material;

a fifth step of producing a space where a stacked capacitor is to be formed, by selectively removing a portion of the interlayer insulating film in the memory cell region, forming a charge preservation electrode on the side wall of the interlayer insulating film, and then removing the portion of the interlayer insulating film in the memory cell;

a sixth step of forming a dielectric film and an upper electrode on the charge preservation electrode; and a seventh step of flatly forming an interlayer insulating film on the resultant structure.

2. The method according to claim 1, wherein the first step comprises the sub-steps of:

flatly forming a first interlayer insulating film on the resultant structure having the gate electrode, the source electrode and the drain electrode;

forming a contact exposing the upper portion of the drain electrode formed in the memory cell region by partially removing the first interlayer insulating film formed in the memory cell region;

forming the first contact plug by filling up the contact with a first conductive material;

forming a second interlayer insulating film on the resultant structure having the first contact plug;

forming contacts exposing the upper portion of the respective electrodes in the logic circuit region and the upper portion of the first contact plug formed on the source electrode in the memory cell region or forming a contact exposing the upper portion of the source electrode, by partially removing the second and first interlayer insulating films in sequence;

flatly forming a second conductive material and a first intermediate insulating film in sequence by filling up the contacts; and forming a bit line exposing the upper portion of the first contact plug formed on the drain electrode by partially removing the first intermediate insulating film and the second conductive material in sequence, and forming the bit line and first interconnection wiring by flatly forming a third interlayer insulating film and a first etching stopper film on the resultant structure.

3. The method according to claim 2, further comprising the step of forming an oxide film over the first etching stopper film.

4. The method according to claim 2, wherein the second step comprises the sub-steps of:

forming a contact exposing the upper portion of the first contact plug formed on the drain electrode by partially removing the first etching stopper film and the third interlayer insulating film;

forming a third conductive material on the resultant structure to fill up the contact; and forming the second contact plug by flatly removing the third conductive material by an etch-back process.

5. The method according to claim 4, wherein the fourth step comprises the sub-steps of:

forming a contact exposing the upper portion of the first interconnection wiring by partially removing the interlayer insulating film, the first etching stopper film, the third interlayer insulating film and the first intermediate insulating film in sequence by an etching process;

forming a concavity by partially removing the interlayer insulating film having the contact by an etching process;

forming a fourth conductive material to fill up the contact and concavity; and forming the second interconnection wiring by flatly removing the fourth conductive material formed on the interlayer insulating film by an etch-back process.

6. The method according to claim 5, wherein the fifth step comprises the sub-steps of:

forming a fifth interlayer insulating film over the resultant structure having the second interconnection wiring;

forming a pattern by partially removing the fifth and fourth interlayer insulating films formed in the memory cell region by an etching process;

forming a conductive material for a charge preservation electrode having a predetermined thickness over the resultant structure having the pattern; and forming a photosensitive film on the conductive material for a charge preservation electrode formed in the logic circuit region.

7. The method according to claim 6, wherein the sixth step comprises the sub-steps of:

etching the exposed conductive material for a charge preservation electrode formed in the logic circuit region to a predetermined thickness;

forming a cylindrical charge preservation electrode in the memory cell region by removing the fifth and fourth interlayer insulating films remaining on the memory cell region and removing the photosensitive film formed in the logic circuit region to expose the upper portion of the second contact plug;

forming a capacitor dielectric film having a predetermined thickness along the step difference on the charge preservation electrode;

forming a conductive material for a plate electrode on the charge preservation electrode by filling up the inside of the cylindrical charge preservation electrode; and forming a plate electrode by sequentially removing the conductive material for a plate electrode formed in the logic circuit region, the capacitor dielectric film and the conductive material for a charge preservation electrode.

8. The method according to claim 4, wherein the fourth step comprises the sub-steps of:

forming a concavity by partially removing the interlayer insulating film formed in the logic circuit region by an etching process;

forming a contact exposing the upper portion of the first interconnection wiring by partially removing the interlayer insulating film of the portion where the concavity is formed, the first etching stopper film, the third interlayer insulating film and the first intermediate insulating film in sequence by an etching process;

forming a fourth conductive material to fill up the contact and concavity; and forming the second interconnection wiring by flatly removing the fourth conductive material formed on the interlayer insulating film by an etch-back process.

9. A method of manufacturing a semiconductor device having a logic circuit region, a transistor having a gate electrode, and source/drain electrodes, and a memory cell region having a stacked capacitor structure, the method comprising the steps of:

a first step of forming a first contact plug connected to the drain electrode, and forming a bit line connected to the source electrode and a first interconnection wiring connected to the respective electrodes in the logic circuit region;

a second step of forming a second contact plug connected to the first contact plug;

a third step of flatly forming an interlayer insulating film over the resultant structure having the second contact plug;

a fourth step of producing a space where a stacked capacitor is to be formed, by selectively removing a portion of the interlayer insulating film in the memory cell region, forming a charge preservation electrode on the side wall of the interlayer insulating film, and then removing the portion of the interlayer insulating film in the memory cell;

a fifth step of forming a dielectric film and an upper electrode on the charge preservation electrode; and a sixth step of flatly forming an interlayer insulating film on the resultant structure.

10. The method according to claim 9, wherein the first step comprises the sub-steps of:

flatly forming a first interlayer insulating film on the resultant structure having the gate electrode, the source electrode and the drain electrode;

forming a contact exposing the upper portions of the source and drain electrodes formed in the memory cell region by partially removing the first interlayer insulating film formed in the memory cell region;

forming the first contact plug by filling up the contact with a first conductive material;

forming a second interlayer insulating film on the resultant structure having the first contact plug;

forming contacts exposing the upper portion of the respective electrodes in the logic circuit region and the upper portion of the first contact plug formed on the source electrode in the memory cell region or forming a contact exposing the upper portion of the source electrode, by partially removing the second and first interlayer insulating films in sequence;

flatly forming a second conductive material and a first intermediate insulating film in sequence by filling up the contacts; and forming a bit line exposing the upper portion of the first contact plug formed on the drain electrode by partially removing the first intermediate insulating film and the second conductive material in sequence, and forming the bit line and first interconnection wiring by flatly forming a third interlayer insulating film and a first etching stopper film on the resultant structure.

11. The method according to claim 10, wherein the first step comprises the sub-steps of:

flatly forming a first interlayer insulating film on the resultant structure having the gate electrode, the source electrode and the drain electrode;

forming a contact exposing the upper portions of the source and drain electrodes formed in the memory cell region by partially removing the first interlayer insulating film formed in the memory cell region;

forming the first contact plug by filling up the contact with a first conductive material;

forming a second interlayer insulating film on the resultant structure having the first contact plug;

forming contacts exposing the upper portion of the respective electrodes in the logic circuit region and the upper portion of the first contact plug formed on the source electrode in the memory cell region or forming a contact exposing the upper portion of the source electrode, by partially removing the second and first interlayer insulating films in sequence;

flatly forming a second conductive material and a first intermediate insulating film in sequence by filling up the contacts; and forming a bit line exposing the upper portion of the first contact plug formed on the drain electrode by partially removing the first intermediate insulating film and the second conductive material in sequence, and forming the bit line and first interconnection wiring by flatly forming a third interlayer insulating film and a first etching stopper film on the resultant structure.

12. The method according to claim 10, further comprising the step of forming an oxide film over the first etching stopper film.

13. The method according to claim 10, wherein the second step comprises the sub-steps of:

forming a contact exposing the upper portion of the first contact plug formed on the drain electrode by partially removing the first etching stopper film and the third interlayer insulating film;

forming a third conductive material on the resultant structure to fill up the contact; and forming the second contact plug by flatly removing the third conductive material by an etch-back process.

14. The method according to claim 13, wherein the fourth step comprises the sub-steps of:

forming a fifth interlayer insulating film over the resultant structure having the second interconnection wiring;

forming a pattern by partially removing the fifth and fourth interlayer insulating films formed in the memory cell region by an etching process;

forming a conductive material for a charge preservation electrode having a predetermined thickness over the resultant structure having the pattern; and forming a photosensitive film on the conductive material for a charge preservation electrode formed in the logic circuit region.

15. The method according to claim 14, wherein the fifth step comprises the sub-steps of:

etching the exposed conductive material for a charge preservation electrode formed in the logic circuit region to a predetermined thickness;

forming a cylindrical charge preservation electrode in the memory cell region by removing the fifth and fourth interlayer insulating films remaining on the memory cell region and removing the photosensitive film formed in the logic circuit region to expose the upper portion of the second contact plug;

forming a capacitor dielectric film having a predetermined thickness along the step difference on the charge preservation electrode; forming a conductive material for a plate electrode on the charge preservation electrode by filling up the inside of the cylindrical charge preservation electrode; and forming a plate electrode by sequentially removing the conductive material for a plate electrode formed in the logic circuit region, the capacitor dielectric film and the conductive material for a charge preservation electrode.

* * * * *